US009270247B2

(12) United States Patent
Jing et al.

(10) Patent No.: US 9,270,247 B2
(45) Date of Patent: Feb. 23, 2016

(54) HIGH QUALITY FACTOR INDUCTIVE AND CAPACITIVE CIRCUIT STRUCTURE

(71) Applicant: Xilinx, Inc., San Jose, CA (US)

(72) Inventors: Jing Jing, San Jose, CA (US); Shuxian Wu, San Jose, CA (US); Zhaoyin D. Wu, San Jose, CA (US)

(73) Assignee: XILINX, INC., San Jose, CA (US)

(*) Notice: Subject to any disclaimer, the term of this patent is extended or adjusted under 35 U.S.C. 154(b) by 188 days.

(21) Appl. No.: 14/092,241

(22) Filed: Nov. 27, 2013

(65) Prior Publication Data

US 2015/0145615 A1    May 28, 2015

(51) Int. Cl.
*H03H 7/01* (2006.01)
*H01L 23/522* (2006.01)
*H01L 27/01* (2006.01)
*H01L 49/02* (2006.01)
*H05K 1/16* (2006.01)
*H03H 5/02* (2006.01)

(52) U.S. Cl.
CPC ......... *H03H 7/0115* (2013.01); *H01L 23/5223* (2013.01); *H01L 23/5227* (2013.01); *H01L 27/016* (2013.01); *H01L 28/10* (2013.01); *H01L 28/60* (2013.01); *H01L 28/88* (2013.01); *H03H 5/02* (2013.01); *H03H 7/0138* (2013.01); *H05K 1/16* (2013.01); *H01L 2924/0002* (2013.01); *Y10T 29/49117* (2015.01)

(58) Field of Classification Search
CPC ..... H03H 7/0138; H03H 5/02; H03H 7/0115; H01F 2017/0026; H01L 23/5227; H01L 27/016; H01L 28/60; H01L 28/88

USPC ................ 333/133, 174–175, 185, 193–196; 336/200
See application file for complete search history.

(56) References Cited

U.S. PATENT DOCUMENTS

| | | |
|---|---|---|
| 1,899,176 A | 2/1933 | Bailey |
| 3,593,319 A | 7/1971 | Barber |
| 4,156,249 A | 5/1979 | Koo |
| 4,249,196 A | 2/1981 | Durney et al. |

(Continued)

FOREIGN PATENT DOCUMENTS

| | | | |
|---|---|---|---|
| DE | 25 48 563 A1 | 5/1977 |
| DE | 100 46 910 A1 | 10/2001 |

(Continued)

OTHER PUBLICATIONS

Amintoosi, Mahmood et al., "Using pattern matching for tiling and packing problems" European Journal of Operational Research, Jul. 10, 2007, pp. 950-960, vol. 83, No. 3, Elsevier, Atlanta, Georgina, USA.

(Continued)

*Primary Examiner* — Benny Lee
*Assistant Examiner* — Rakesh Patel
(74) *Attorney, Agent, or Firm* — Kevin T. Cuenot; John J. King

(57) ABSTRACT

A circuit includes a first finger capacitor having a first bus line coupled to a first plurality of finger elements and a second bus line coupled to a second plurality of finger elements. The first bus line is parallel to the second bus line. The circuit further includes an inductor having a first leg oriented perpendicular to the first bus line and the second bus line. The first leg of the inductor is coupled to a center of the first bus line.

20 Claims, 5 Drawing Sheets

(56) References Cited

U.S. PATENT DOCUMENTS

| | | | |
|---|---|---|---|
| 4,409,608 A | 10/1983 | Yoder |
| 4,427,457 A | 1/1984 | Carlson et al. |
| 4,470,096 A | 9/1984 | Guertin |
| 4,470,099 A | 9/1984 | Sawairi |
| 4,571,543 A | 2/1986 | Raymond et al. |
| 4,639,686 A | 1/1987 | Beckenbach et al. |
| 4,700,457 A | 10/1987 | Matsukawa |
| 4,731,696 A | 3/1988 | Himes et al. |
| 4,827,323 A | 5/1989 | Tigelaar et al. |
| 4,831,431 A | 5/1989 | Hanlon |
| 4,878,151 A | 10/1989 | Gallichio |
| 4,914,546 A | 4/1990 | Alter |
| 4,937,649 A | 6/1990 | Shiba et al. |
| 4,994,688 A | 2/1991 | Horiguchi et al. |
| 5,005,103 A | 4/1991 | Kwon et al. |
| 5,021,920 A | 6/1991 | Smith |
| 5,077,225 A | 12/1991 | Lee |
| 5,083,184 A | 1/1992 | Eguchi |
| 5,089,878 A | 2/1992 | Lee |
| 5,117,114 A | 5/1992 | Street et al. |
| 5,119,169 A | 6/1992 | Kozono et al. |
| 5,142,639 A | 8/1992 | Kohyama et al. |
| 5,155,658 A | 10/1992 | Inam et al. |
| 5,166,858 A | 11/1992 | Frake et al. |
| 5,172,299 A | 12/1992 | Yamada et al. |
| 5,177,410 A | 1/1993 | Hashiguchi et al. |
| 5,189,594 A | 2/1993 | Hoshiba |
| 5,208,725 A | 5/1993 | Akcasu |
| 5,275,974 A | 1/1994 | Ellul et al. |
| 5,583,359 A | 12/1996 | Ng et al. |
| 5,712,813 A | 1/1998 | Zhang |
| 5,868,388 A | 2/1999 | Wood et al. |
| 5,939,766 A | 8/1999 | Stolmeijer et al. |
| 6,037,621 A | 3/2000 | Wilson |
| 6,064,108 A | 5/2000 | Martinez |
| 6,066,537 A | 5/2000 | Poh |
| 6,297,524 B1 | 10/2001 | Vathulya et al. |
| 6,303,456 B1 | 10/2001 | Pricer et al. |
| 6,303,457 B1 | 10/2001 | Christensen et al. |
| 6,383,858 B1 | 5/2002 | Gupta et al. |
| 6,385,033 B1 | 5/2002 | Javanifard et al. |
| 6,410,954 B1 | 6/2002 | Sowlati et al. |
| 6,417,556 B1 | 7/2002 | Long et al. |
| 6,437,431 B1 | 8/2002 | Mbouombouo et al. |
| 6,448,873 B1 | 9/2002 | Mostove |
| 6,542,351 B1 | 4/2003 | Kwang |
| 6,548,400 B2 | 4/2003 | Brennan et al. |
| 6,570,210 B1 | 5/2003 | Sowlati et al. |
| 6,597,562 B1 | 7/2003 | Hu et al. |
| 6,625,006 B1 | 9/2003 | Aram et al. |
| 6,653,681 B2 | 11/2003 | Appel |
| 6,661,079 B1 | 12/2003 | Bikulcius |
| 6,690,570 B2 | 2/2004 | Hajimiri et al. |
| 6,737,698 B1 | 5/2004 | Paul et al. |
| 6,747,307 B1 | 6/2004 | Vathulya et al. |
| 6,765,778 B1 | 7/2004 | Du et al. |
| 6,819,542 B2 | 11/2004 | Tsai et al. |
| 6,822,312 B2 | 11/2004 | Sowlati et al. |
| 6,880,134 B2 | 4/2005 | Drennan |
| 6,882,015 B2 | 4/2005 | Bernstein et al. |
| 6,897,505 B2 | 5/2005 | Aton |
| 6,903,918 B1 | 6/2005 | Brennan |
| 6,927,125 B2 | 8/2005 | Jones et al. |
| 6,933,551 B1 | 8/2005 | Stribley et al. |
| 6,933,869 B1 | 8/2005 | Starr et al. |
| 6,949,781 B2 | 9/2005 | Chang et al. |
| 6,963,122 B1 | 11/2005 | Soenen et al. |
| 6,972,463 B2 | 12/2005 | Cheng |
| 6,974,744 B1 | 12/2005 | Aram et al. |
| 7,009,832 B1 | 3/2006 | Chen et al. |
| 7,013,436 B1 | 3/2006 | Morton et al. |
| 7,027,287 B2 | 4/2006 | Georgakos |
| 7,038,296 B2 | 5/2006 | Laws |
| 7,050,290 B2 | 5/2006 | Tang et al. |
| 7,116,544 B1 | 10/2006 | Sutardja |
| 7,154,734 B2 | 12/2006 | Schultz et al. |
| 7,161,228 B1 | 1/2007 | Pettit |
| 7,170,178 B2 | 1/2007 | Bely et al. |
| 7,193,263 B2 | 3/2007 | Barth |
| 7,195,971 B2 | 3/2007 | Bernstein et al. |
| 7,202,548 B2 | 4/2007 | Lee |
| 7,205,854 B2 | 4/2007 | Liu |
| 7,238,981 B2 | 7/2007 | Marotta |
| 7,259,945 B2 | 8/2007 | Cleveland |
| 7,259,956 B2 | 8/2007 | Fong et al. |
| 7,271,465 B2 | 9/2007 | Jessie et al. |
| 7,274,085 B1 | 9/2007 | Hsu et al. |
| 7,286,071 B1 | 10/2007 | Hsueh et al. |
| 7,298,001 B1 | 11/2007 | Liu et al. |
| 7,348,624 B2 | 3/2008 | Sakaguchi et al. |
| 7,394,274 B2 | 7/2008 | Muniandy et al. |
| 7,439,570 B2 | 10/2008 | Anthony |
| 7,485,914 B2 | 2/2009 | Huang et al. |
| 7,564,264 B1 | 7/2009 | Morrison et al. |
| 7,564,675 B2 | 7/2009 | Chen et al. |
| 7,663,233 B2 | 2/2010 | Lim |
| 7,768,054 B2 | 8/2010 | Benetik |
| 7,944,732 B2 | 5/2011 | de Jong et al. |
| 7,956,438 B2 | 6/2011 | Quinn |
| 7,994,609 B2 | 8/2011 | Quinn |
| 7,994,610 B1 | 8/2011 | Quinn |
| 8,207,592 B2 | 6/2012 | Quinn |
| 8,362,589 B2 | 1/2013 | Quinn |
| 8,653,844 B2 | 2/2014 | Sadoughi et al. |
| 8,941,974 B2 | 1/2015 | Wu et al. |
| 2002/0171510 A1 | 11/2002 | Kushitani et al. |
| 2003/0132475 A1 | 7/2003 | Kanamori |
| 2003/0183863 A1* | 10/2003 | Nakao et al. ............ 257/307 |
| 2003/0183884 A1 | 10/2003 | Miyazawa |
| 2005/0077581 A1 | 4/2005 | Chang et al. |
| 2005/0135042 A1 | 6/2005 | Chiu-Kit Fong et al. |
| 2005/0161725 A1 | 7/2005 | Da Dalt |
| 2006/0203424 A1 | 9/2006 | Chen et al. |
| 2007/0096720 A1 | 5/2007 | Clements et al. |
| 2007/0181973 A1 | 8/2007 | Hung et al. |
| 2007/0190760 A1 | 8/2007 | Coolbaugh et al. |
| 2007/0278551 A1 | 12/2007 | Anthony |
| 2007/0296013 A1 | 12/2007 | Chang et al. |
| 2008/0084255 A1* | 4/2008 | El Rai et al. ............ 333/185 |
| 2008/0123245 A1 | 5/2008 | Lee et al. |
| 2008/0128857 A1 | 6/2008 | Bi |
| 2008/0239619 A1 | 10/2008 | Okamoto et al. |
| 2009/0057826 A1 | 3/2009 | Kim et al. |
| 2009/0322447 A1 | 12/2009 | Daley et al. |
| 2010/0072572 A1 | 3/2010 | Baumgartner et al. |
| 2010/0125989 A1 | 5/2010 | Huang et al. |
| 2010/0127348 A1 | 5/2010 | Quinn |
| 2010/0127349 A1 | 5/2010 | Quinn |
| 2012/0212877 A1 | 8/2012 | Lu |
| 2012/0229203 A1 | 9/2012 | Sadoughi et al. |
| 2013/0093047 A1* | 4/2013 | Huang et al. ............ 257/532 |

FOREIGN PATENT DOCUMENTS

| | | |
|---|---|---|
| DE | 10145 462 A1 | 4/2003 |
| GB | 1 149 569 | 4/1969 |
| GB | 1 469 944 A | 4/1977 |
| JP | 57-106804 | 7/1982 |
| JP | 58-051552 | 3/1983 |
| JP | 59-91718 | 6/1984 |
| JP | 61-259560 A | 11/1986 |
| JP | 61-263251 A | 11/1986 |
| JP | 63-070550 | 3/1988 |
| JP | 01-084616 A | 3/1989 |
| JP | 01-096943 A | 4/1989 |
| JP | 01-298322 A | 12/1989 |
| JP | 01-313917 | 12/1989 |
| JP | 02-231755 A | 9/1990 |
| JP | 02-268439 | 11/1990 |
| JP | 02-307275 | 12/1990 |
| JP | 03-008360 | 1/1991 |
| JP | 03-071612 | 3/1991 |
| JP | 04-268756 | 9/1992 |
| JP | 07-283076 | 10/1995 |

(56) References Cited

FOREIGN PATENT DOCUMENTS

| | | |
|---|---|---|
| JP | 09-199973 A | 7/1997 |
| JP | 11-274887 A | 10/1999 |
| JP | 2001-267503 A | 9/2001 |
| WO | WO 03/090280 | 10/2003 |

OTHER PUBLICATIONS

Aparicio, Robert et al., "Capacity Limits and Matching Properties of Integrated Capacitors," IEEE Journal of Solid-State Circuits, Mar. 2002, pp. 384-393, vol. 37, No. 3, IEEE, Piscataway, New Jersey, USA.

Bersuker, Gennadi et al., "Mechanism of Electron Trapping and Characteristics of Traps in HfO2 Gate Stacks," IEEE Transactions on Device and Materials Reliability, Mar. 2007, pp. 138-145, vol. 7, No. 1, IEEE, Piscataway, New Jersey, USA.

Chan, Chi Hou et al., "Analysis of MMIC Structures Using an Efficient Iterative Approach," IEEE Transactions on Microwave Theory and Techniques, Jan. 1988, pp. 96-105, vol. 36, No. 1, IEEE, Piscataway, New Jersey, USA.

Fukuda, Hiroshi et al., "Enumeration of Polyominoes, Polyiamonds and Polyhexes for Isohedral Tilings with Rotational Symmetry," Computational Geometry and Graph Theory, Jun. 11, 2007, pp. 68-78, Springer Berlin Heidelberg, Berlin Heidelberg, Germany.

Imamura, Akira et al., "Bending-Comb Capacitor with a Small Parasitic Inductance," Proc. of the 2002 Symposium on VLSI Circuits Digest of Technical Papers, Jun. 13, 2002, pp. 22-25, IEEE, Piscataway, New Jersey, USA.

Jacobsen, Jesper Lykke, "Tetromino tilings and the Tutte polynomial," Journal of Physics A: Mathematical and Theoretical, Feb. 16, 2007, pp. 1439-1446, vol. 40, No. 7, IOP Publishing, Bristol, United Kingdom.

Keane, John et al., "An On-Chip NBTI Sensor for Measuring pMOS Threshold Voltage Degradation;" IEEE Transactions on Very Large Scale Integration (VLSI) Systems, Oct. 30, 2009, p. 947-956, IEEE, Piscataway, New Jersey, USA.

Rajagopalan, Jay et al., "Optimization of Metal-Metal Comb-Capacitors for RF Applications," Wireless Design & Development, Mar. 4, 2001, pp. 1-4, Wireless Design and Development, Madison, Wisconsin, USA.

Rhoads, Glenn C., "Planar tilings by polyominoes, polyhexes and polyiamonds," Journal of Computational and Applied Mathematics, Feb. 15, 2005, pp. 329-353, vol. 174, No. 2, Elsevier, Atlanta, Georgina, USA.

Samavati, Hirad et al., "Fractal Capacitors," IEEE Journal of Solid-State Circuit, Dec. 1998, pp. 2035-2041, vol. 33, No. 12, IEEE, Piscataway, New Jersey, USA.

Sowlati, Tirdad et al., "High Density Capacitance Structures in Submicron CMOS for Low Power RF Applications," Proc. of the International Symposium on Low Power Electronics and Design, Aug. 6, 2001, pp. 243-246, IEEE, Piscataway, New Jersey, USA.

Wakayama, Myles H. et al., "A 30-MHz Low-Jitter High-Linearity CMOS Voltage-Controlled Oscillator", IEEE Journal of Solid-State Circuits, Dec. 1987, pp. 1074-1081, vol. sc-22, No. 6, IEEE, Piscataway, New Jersey, USA.

* cited by examiner

800

Provide first finger capacitor having a first bus line attached to a first plurality of finger elements and a second bus line attached to a second plurality of finger elements, wherein the first bus line is parallel to the second bus line
805

Provide an inductor having a first leg oriented perpendicular to the first bus line and the second bus line, wherein the first leg is attached to a center of the first bus line
810

Form the first plurality of finger elements and the second plurality of finger elements perpendicular to the bus lines and alternate individual ones of the first plurality of finger elements with individual ones of the second plurality of finger elements
815

Provide second finger capacitor having a third bus line attached to a third plurality of finger elements and a fourth bus line attached to a fourth plurality of finger elements, wherein the third bus line and the fourth bus line are parallel to the first bus line, the inductor includes a second leg parallel to the first leg, and the second leg of the inductor is attached to a center of the third bus line
820

Vary capacitance by selectively connecting the second bus line to the fourth bus line using a switch
825

HIGH QUALITY FACTOR INDUCTIVE AND CAPACITIVE CIRCUIT STRUCTURE

TECHNICAL FIELD

This disclosure relates to semiconductor integrated circuits (ICs), and more particularly to a high quality factor capacitive and inductive circuit structure for use within a semiconductor IC.

BACKGROUND

Modern integrated circuits (ICs) are often required to operate at frequencies well within the gigahertz range. With respect to frequencies of 10 GHz or less, a variety circuit structures are known to provide acceptable performance. Known inductor-capacitor (LC) circuit structures, for example, can be implemented that operate at 10 GHz or less with a suitably high quality (Q) factor. These LC circuit structures incorporate finger capacitors.

The Q factor of a circuit generally decreases as frequency increases. As frequencies increase beyond 10 GHz, performance of conventional LC circuit structures begins to degrade markedly. As an example, the Q factor of a conventional LC circuit structure that utilizes finger capacitors can be expected to decrease by as much as 67 percent when frequency is increased from approximately 10 GHz to approximately 32 GHz.

Techniques for improving the Q factor of an LC circuit structure at such high frequencies have included increasing the width of the bus line of the finger capacitors, increasing the width of the finger elements of the finger capacitors, or both. These techniques, however, consume significant area thereby reducing the area available within the IC for other circuitry and/or increasing the size of the IC itself. Further, increased widths of the bus line and/or finger elements increases parasitic capacitances in the LC circuit structure. Increased parasitic capacitance can degrade the tuning range of circuits such as voltage controlled oscillators and/or other circuits that typically rely upon or incorporate the LC circuit structure.

SUMMARY

A circuit includes a first finger capacitor having a first bus line coupled to a first plurality of finger elements and a second bus line coupled to a second plurality of finger elements. The first bus line is parallel to the second bus line. The circuit also includes an inductor having a first leg oriented perpendicular to the first bus line and the second bus line. The first leg of the inductor is coupled to a center of the first bus line.

In one aspect, the first plurality of finger elements and the second plurality of finger elements are perpendicular to the bus lines. Individual ones of the first plurality of finger elements alternate with individual ones of the second plurality of finger elements.

In addition, the first bus line, the second bus line, the first plurality of finger elements, and the second plurality of finger elements can be implemented in a same plane. As such, the inductor may be implemented in at least a second plane different from the first plane and parallel to the first plane.

The circuit also can include a second finger capacitor having a third bus line coupled to a third plurality of finger elements and a fourth bus line coupled to a fourth plurality of finger elements. The third bus line and the fourth bus line are parallel to the first bus line. The first leg of the inductor is coupled to a center of the third bus line.

In another aspect, the circuit includes a second finger capacitor having a third bus line coupled to a third plurality of finger elements and a fourth bus line coupled to a fourth plurality of finger elements. The third bus line and the fourth bus line are parallel to the first bus line. The inductor can include a second leg parallel to the first leg where the second leg of the inductor is coupled to a center of the third bus line. The circuit also can include a first switch configured to selectively connect the second bus line to the fourth bus line.

In a further aspect, where the second finger capacitor is coupled to the second leg of the inductor, the circuit can include a third finger capacitor having a fifth bus line coupled to a fifth plurality of finger elements and a sixth bus line coupled to a sixth plurality of finger elements. The fifth bus line and the sixth bus line are parallel to the first bus line. The first leg of the inductor is coupled to a center of the fifth bus line. The circuit further can include a fourth finger capacitor having a seventh bus line coupled to a seventh plurality of finger elements and an eighth bus line coupled to an eighth plurality of finger elements. The seventh bus line and the eighth bus line are parallel to the first bus line. The second leg of the inductor is coupled to a center of the seventh bus line. The circuit also can include a second switch configured to selectively connect the sixth bus line to the eighth bus line.

A circuit includes a first plurality of finger capacitors, wherein each finger capacitor of the first plurality of finger capacitors includes a first bus line coupled to a first plurality of finger elements and a second bus line parallel to the first bus line and coupled to a second plurality of finger elements. The circuit includes a second plurality of finger capacitors, wherein each finger capacitor of the second plurality of finger capacitors includes a third bus line coupled to a third plurality of finger elements and a fourth bus line parallel to the third bus line and coupled to a fourth plurality of finger elements. The third bus line is parallel to the first bus line. The circuit also includes an inductor having a first leg oriented perpendicular to the first bus line and a second leg parallel to the first leg. The first leg of the inductor is coupled to a center of each first bus line of the first plurality of finger capacitors. The second leg of the inductor is coupled to a center of each third bus line of the second plurality of finger capacitors.

The circuit also can include a plurality of switches. Each switch can be individually configurable to connect a second bus line to a fourth bus line.

A method includes providing a first finger capacitor of a circuit, wherein the first finger capacitor includes a first bus line coupled to a first plurality of finger elements and a second bus line coupled to a second plurality of finger elements. The first bus line is parallel to the second bus line. The method also can include providing an inductor having a first leg oriented perpendicular to the first bus line and the second bus line. The first leg of the inductor is coupled to a center of the first bus line.

In one aspect, the first plurality of finger elements and the second plurality of finger elements are perpendicular to the bus lines; and individual ones of the first plurality of finger elements alternate with individual ones of the second plurality of finger elements.

The method can include implementing the first bus line, the second bus line, the first plurality of finger elements, and the second plurality of finger elements in a same plane. The method further can include implementing the inductor in at least a second plane different from the first plane and parallel to the first plane.

In another aspect, the method can include providing a second finger capacitor having a third bus line coupled to a third plurality of finger elements and a fourth bus line coupled to a fourth plurality of finger elements. The third bus line and the fourth bus line are parallel to the first bus line. The first leg of the inductor is coupled to a center of the third bus line.

In a further aspect, the method can include providing a second finger capacitor having a third bus line coupled to a third plurality of finger elements and a fourth bus line coupled to a fourth plurality of finger elements. The third bus line and the fourth bus line are parallel to the first bus line. The inductor can include a second leg parallel to the first leg. The second leg of the inductor is coupled to a center of the third bus line.

The method further can include varying a capacitance of the circuit by selectively connecting the second bus line to the fourth bus line using a first switch.

In still another aspect, where the second finger capacitor is coupled to the second leg of the inductor, the method can include providing a third finger capacitor having a fifth bus line coupled to a fifth plurality of finger elements and a sixth bus line coupled to a sixth plurality of finger elements. The fifth bus line and the sixth bus line are parallel to the first bus line. The first leg of the inductor is coupled to a center of the fifth bus line. The method also can include providing a fourth finger capacitor having a seventh bus line coupled to a seventh plurality of finger elements and an eighth bus line coupled to an eighth plurality of finger elements. The seventh bus line and the eighth bus line are parallel to the first bus line. The second leg of the inductor is coupled to a center of the seventh bus line.

The method also can include varying the capacitance of the circuit by selectively connecting the sixth bus line to the eighth bus line using a second switch.

BRIEF DESCRIPTION OF THE DRAWINGS

FIG. 8 is a flow chart illustrating an exemplary method of creating an LC circuit structure.

DETAILED DESCRIPTION

Figure 1:
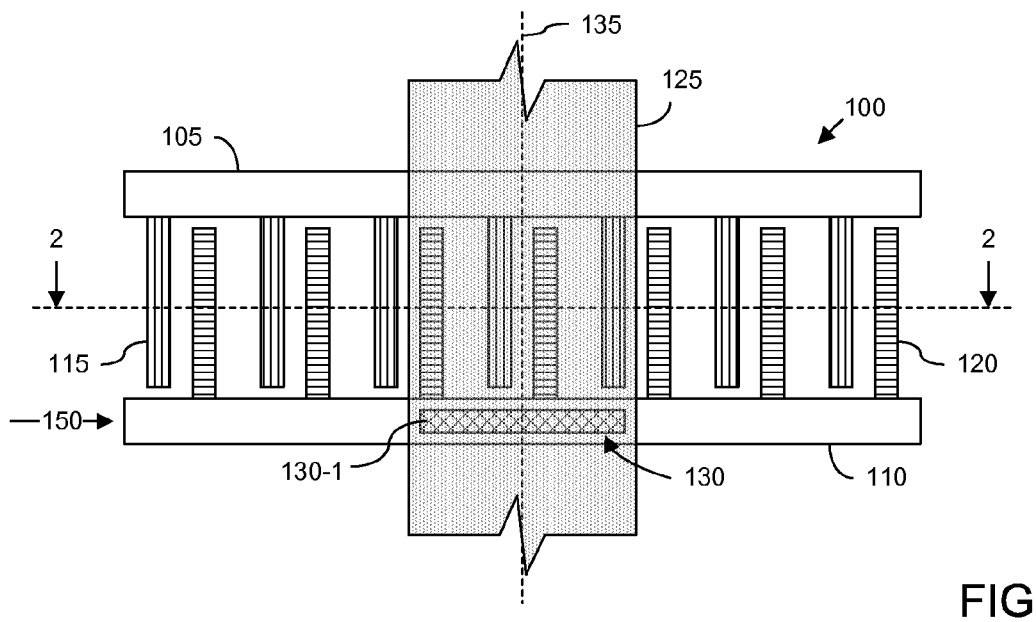
FIG. 1 is a block diagram illustrating an exemplary circuit structure including a finger capacitor.

While the disclosure concludes with claims defining novel features, it is believed that the various features described herein will be better understood from a consideration of the description in conjunction with the drawings. The process(es), machine(s), manufacture(s) and any variations thereof described within this disclosure are provided for purposes of illustration. Any specific structural and functional details described are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to semiconductor integrated circuits (ICs) and, more particularly, to a high quality factor capacitive and inductive circuit structure for use within a semiconductor IC. In accordance with the inventive arrangements disclosed herein, a circuit structure is described that provides a high quality (Q) factor throughout a wide range of frequencies including frequencies exceeding approximately 10 GHz. The circuit structure provides an improved Q factor compared to conventional circuit structures for frequencies in and around approximately 32 GHz and up to approximately 52 GHz.

The circuit structure includes an inductor and one or more finger capacitors. Each finger capacitor includes a first bus line and a second bus line. Finger elements of the finger capacitor are coupled to each of the first bus line and the second bus line. The inductor includes legs that are coupled to the finger capacitor(s). More particularly, the leg of the inductor is coupled to a center of the bus line of each finger capacitor that is used.

By coupling the legs of the inductor to the center of the bus lines of the finger capacitors, current is injected into each finger capacitor from the inductor at the center of the finger capacitor. In consequence, the length of the path that the current travels within the finger capacitor is reduced to approximately one-half that of other circuit structures that inject current into the edge of the bus line of the finger capacitor. The reduced length of the current path results in reduced series resistance for the circuit structure, thereby increasing the Q factor. Coupling the inductor leg(s) to centers of bus lines, as described within this disclosure, can increase the Q factor of a circuit structure by approximately 60% over edge-connected configurations at selected frequencies.

For purposes of simplicity and clarity of illustration, elements shown in the figures are not necessarily drawn to scale. For example, the dimensions of some of the elements may be exaggerated relative to other elements for clarity. Further, where considered appropriate, reference numbers are repeated among the figures to indicate corresponding, analogous, or like features.

FIG. 1 is a block diagram illustrating an exemplary circuit structure including a finger capacitor 100. The circuit of FIG. 1 is implemented within a semiconductor IC and is shown in a layout view. As pictured, finger capacitor 100 includes a bus line 105 and a bus line 110. Bus line 105 is parallel to bus line 110. Bus line 105 is coupled to a plurality of finger elements 115. Finger elements 115 are shaded with vertical lines. Bus line 110 is coupled to a plurality of finger elements 120. Finger elements 120 are shaded with horizontal lines. Finger elements 115 and finger elements 120 are perpendicular to each of bus lines 105 and 110. Accordingly finger elements 115 and 120 are parallel to one another.

As pictured in FIG. 1, individual ones of finger elements 115 alternate with individual ones of finger elements 120. More particularly, moving from left to right across finger capacitor 100, finger elements are arranged in a repeating pattern in which finger element 115 is followed by a finger element 120, which is followed by another finger element 115, which is followed by another finger element 120, etc.

Bus line 105 and finger elements 115 are pictured in FIG. 1 with different shading to more clearly illustrate the different portions of finger capacitor 100. It should be appreciated that in one aspect, bus line 105 and finger elements 115 are formed of a continuous portion of a conductive layer of the semiconductor IC. For example, bus line 105 and finger elements 115 can be formed of one continuous portion of metal. Similarly, bus line 110 and finger elements 120 are shaded differently but may be implemented as a continuous portion of a conductive layer such as metal within the semiconductor IC.

A portion of an inductor is formed over finger capacitor 100. The portion of the inductor is a leg 125 portion of the inductor. Leg 125 is implemented in a different conductive layer than finger capacitor 100. In the example shown, leg 125 is formed in a metal layer above finger capacitor 100. For purposes of illustration, leg 125 is shown in semi-transparent form to more clearly illustrate the placement of leg 125 with respect to finger capacitor 100 and the connection formed between leg 125 and finger capacitor 100.

Leg 125 is located above a center of bus line 110. As defined herein, the "center" of a bus line is a line that bisects the bus line into two equal lengths or halves. The center of bus line 110 and, at least in this example, the center of bus line 105, is illustrated using dashed line 135. Dashed line 135 bisects bus line 105, bus line 110, and leg 125.

Leg 125 is coupled to finger capacitor 100 using a via structure 130. Via structure 130 attaches bus line 110 to leg 125. Via structure 130 further is bisected by line 135 and, as such, like bus lines 105 and 110, is symmetric about line 135. In one aspect, via structure 130 is implemented as a single, larger via sometimes referred to as a "trench" via. Via 130-1 in FIG. 1 represents a trench via attaching leg 125 to a center of bus line 110. In another example, a single standard sized and/or shaped via may be used to connect leg 125 to the center of bus line 110.

Current from leg 125 is injected into bus line 110 at the center through via structure 130. As such, current travels outward to each respective end of bus line 110 from the center marked by line 135. Current further flows down through fingers 120. As noted, this reduces the path that current travels compared to conventional LC circuit structures that inject current into an edge of a bus line as illustrated by arrow 150. Injecting current at the location of arrow 150, i.e., at an edge of bus line 110, results in a longer path for the current to travel, increased resistance, and lower Q factor than the exemplary implementation pictured in FIG. 1.

Figure 2:
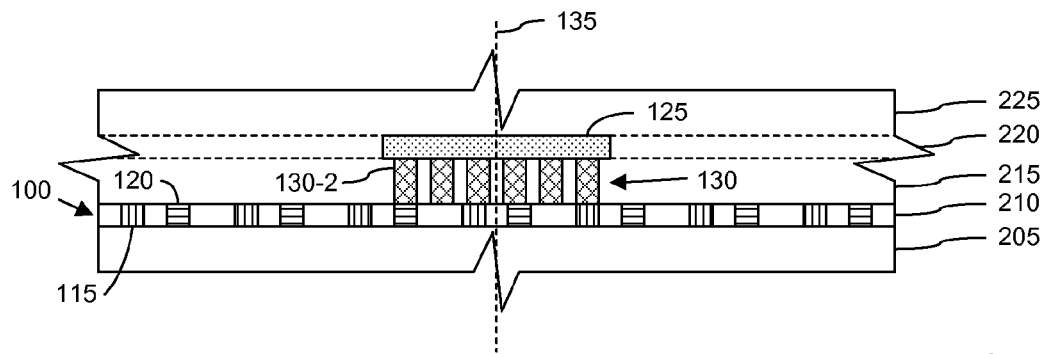
FIG. 2 is a cross-sectional side view of the circuit structure of FIG. 1.

FIG. 2 is a cross-sectional side view of the circuit structure of FIG. 1. FIG. 2 illustrates a view taken along cut line 2-2 in FIG. 1. FIG. 2 illustrates a plurality of IC processing layers used to form finger capacitor 100 and leg 125 of the inductor. As illustrated in FIG. 2, the layers include an insulating layer 205, a conductive layer 210, an insulating layer 215, a conductive layer 220, and another insulating layer 225. Conductive layers 210 and 220 may be implemented as metal layers, e.g., as patterned metal layers. One or more additional layers may be included above layer 225 and/or below layer 205 to implement further circuit structures, whether passive or active.

In the example of FIG. 2, finger capacitor 100 is implemented using a single metal layer and, as such, is implemented within a same plane. More particularly, bus line 105, bus line 110, finger elements 115, and finger elements 120 are implemented in conductive layer 210 and, as such, are in a same plane. Leg 125 is implemented in conductive layer 220. Leg 125 is coupled to bus line 110 by via structure 130. Via structure 130 is implemented to extend through insulating layer 210 to connect bus line 110 to leg 125.

In the example presented in FIG. 2, via structure 130 is implemented as a plurality of smaller vias 130-2. An even number of vias 130-2 is illustrated in FIG. 2. Accordingly, no single via 130-2 is bisected by line 135. The overall via structure 130, however, is bisected and symmetric about line 135 thereby approximating a connection to the center of bus line 110. As such, via structure 130, being implemented as vias 130-2, can be said to be connected to the center of bus line 110. In the case where an odd number of vias 130-2 is used, one of such vias 130-2 would be bisected by line 135.

Figure 3:
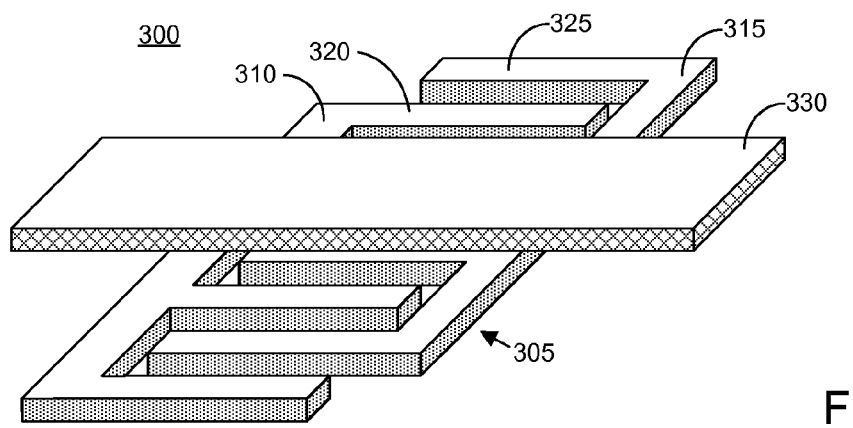
FIG. 3 is a perspective view of another exemplary circuit structure including a finger capacitor.

FIG. 3 is a perspective view of another exemplary circuit structure 300 including a finger capacitor 305. Finger capacitor 305 includes a bus line 310 and a bus line 315. Bus line 310 is coupled to a plurality of finger elements 320. Bus line 315 is coupled to a plurality of finger elements 325. A leg 330 of an inductor is implemented above finger capacitor 305 and connects to a center of bus line 315. A via structure, which is obstructed from view, is used to attach leg 330 to bus line 315.

Figure 4:
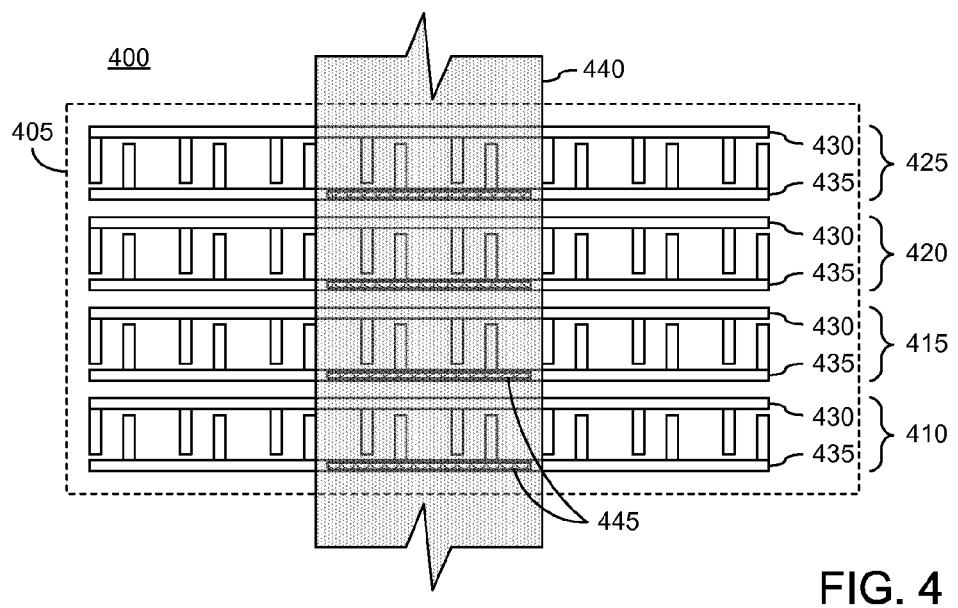
FIG. 4 is a block diagram illustrating an exemplary circuit structure including a finger capacitor array.

FIG. 4 is block diagram illustrating an exemplary circuit structure 400 including a finger capacitor array 405. The term "array," as used herein, means two or more of the noted circuit element type. The elements of the array typically are interconnected. In many cases, the array is implemented to be symmetric about a selected axis or origin. Further, each individual element of an array is usually implemented to be equivalent or identical to each other circuit element of the array.

Finger capacitor array 405 includes finger capacitors 410, 415, 420, and 425. In one aspect, being part of finger capacitor array 405, each of finger capacitors 410, 415, 420, and 425 can be implemented as a same, e.g., a "unit," finger capacitor. For example, finger capacitors 410, 415, 420, and 425 are identical having the same capacitive value or a value within a defined tolerance range of one another. In the example pictured in FIG. 4, each of finger capacitors 410, 415, 420, and 425 is aligned. Further, a same spacing is maintained between adjacent ones of finger capacitors 410, 415, 420, and 425 where, for example, the distance that separates finger capacitor 410 from finger capacitor 415 is the same as the distance separating finger capacitor 415 from finger capacitor 420, etc.

Each of finger capacitors 410, 415, 420, and 425 includes a bus line 430 and a bus line 435. A plurality of finger elements are coupled to each of bus lines 430 and 435. A leg 440 of an inductor is illustrated in semi-transparent form to better show via structures 445 that attach a center of each of bus line 435 to leg 440.

Each of finger capacitors 410, 415, 420, and 425 is implemented substantially as described with reference to FIGS. 1-3. Similarly, leg 440 of the inductor is coupled to each of bus lines 435 of finger capacitors 410, 415, 420, and 425 substantially as described using a via structure including one or more vias.

Figure 5:
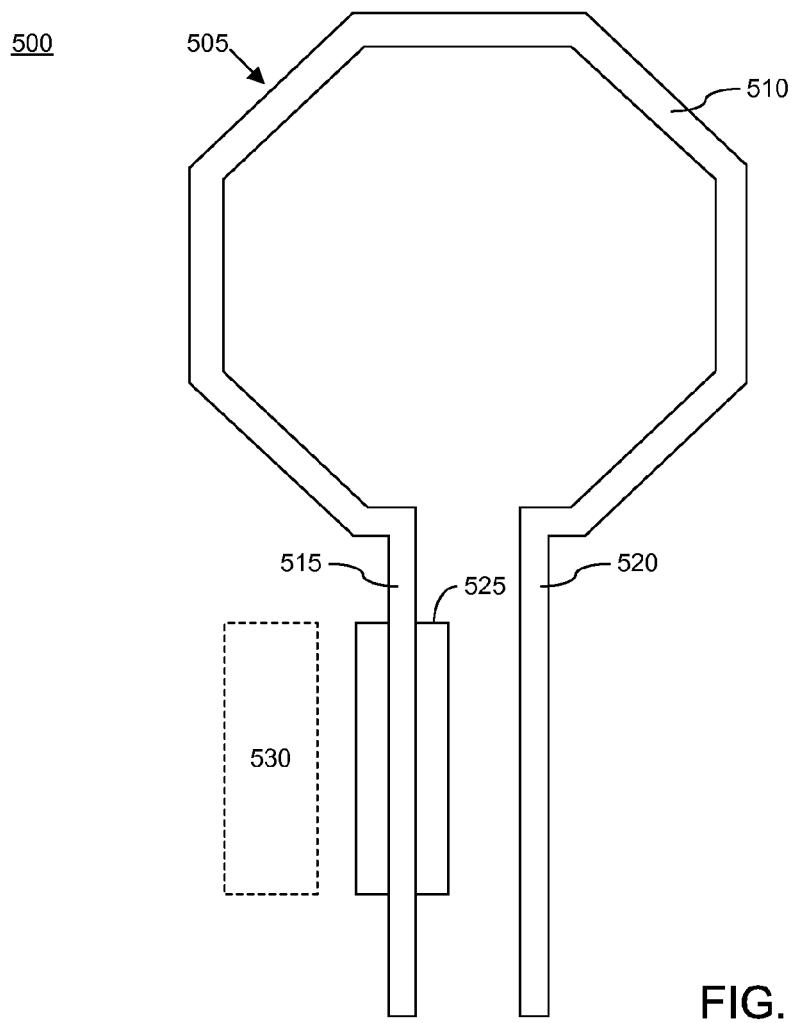
FIG. 5 is a block diagram illustrating an exemplary inductor-capacitor (LC) circuit structure.

FIG. 5 is a block diagram illustrating an exemplary inductor-capacitor (LC) circuit structure 500. LC circuit structure 500 includes an inductor 505 having one or more loops 510, a leg 515, and a leg 520. Leg 515 is parallel to leg 520.

In the example shown, inductor 505 includes a single loop or turn. It should be appreciated, however, that inductor 505 is not intended to be limited by the number of loops shown. Inductor 505 may include one or more additional full loops and/or one or more additional partial loops. In addition, the shape of loop 510, or loops as the case may be, of inductor 505 is not intended to be limited to octagonal. Loop 510 can be formed with a circular shape, a square shape, an oval shape, a spiral shape, or the like in accordance with the constraints of the particular IC fabrication technology that is used.

Leg 515 is positioned above, and connects to, a finger capacitor element 525. Finger capacitor element 525 may be implemented as a finger capacitor as described with reference to FIGS. 1-3 or as a finger capacitor array as described with reference to FIG. 4. Leg 515 is positioned above finger capacitor element 525 and bisects finger capacitor element 525. A center of one bus line of each finger capacitor of finger capacitor element 525 is coupled to leg 515 using a via structure (not shown). As noted, the via structure that attaches a bus line of each finger capacitor of finger capacitor element 525 to leg 515 is symmetric about the center of each bus line.

A conventional LC circuit structure locates the finger capacitor array to the side of the leg of the inductor. Referring to FIG. 5, for example, a conventional design locates a finger capacitor array in the location of block 530, shown with a dashed line. As pictured, the location of block 530 is completely to the left of leg 515 so that current is injected into the edge of the bus lines as opposed to the centers.

Figure 6:
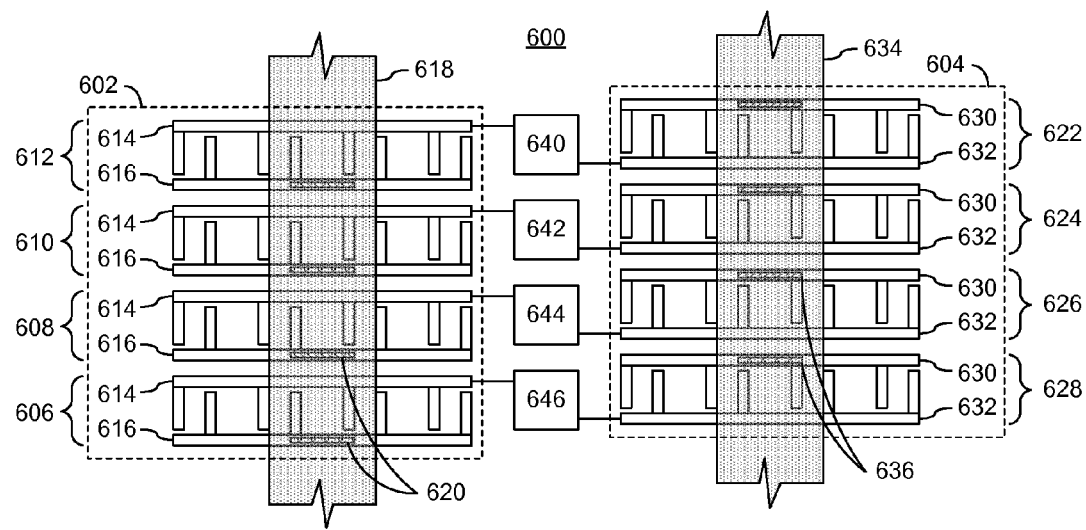
FIG. 6 is a block diagram illustrating an exemplary circuit structure including finger capacitor arrays.

FIG. 6 is a block diagram illustrating an exemplary circuit structure 600 including finger capacitor arrays 602 and 604. Finger capacitor array 602 includes finger capacitors 606, 608, 610, and 612. Each of finger capacitors 606, 608, 610, and 612 includes a bus line 614 and a bus line 616. A plurality of finger elements are coupled to each of bus lines 614 and 616. A first leg 618 of an inductor is illustrated in semitransparent form to better show via structures 620 that attach a center of each bus line 616 to leg 618 thereby forming a connection between finger capacitor array 602 and leg 618.

Finger capacitor array 604 includes finger capacitors 622, 624, 626, and 628. Each of finger capacitors 622, 624, 626, and 628 includes a bus line 630 and a bus line 632. A plurality of finger elements are coupled to each of bus lines 630 and 632. A second leg 634 of the inductor is illustrated in semitransparent form to better show via structures 636 that attach a center of each bus line 630 to leg 634 thereby forming a connection between finger capacitor array 604 and leg 634.

Finger capacitor arrays 602 and 604 are implemented substantially as described with reference to FIG. 4. As such, each of finger capacitors 606, 608, 610, 612, 622, 624, 626, and 628 is implemented substantially the same as described with reference to FIGS. 1-3. Accordingly, leg 618 of the inductor is coupled to a center of each of bus lines 616 of finger capacitors 606, 608, 610, and 612 substantially as described using via structure 620. Similarly, leg 634 of the inductor is coupled to a center of each of bus lines 630 of finger capacitors 622, 624, 626, and 628 substantially as described using a via structure 636.

FIG. 6 further includes a plurality of switches 640, 642, 644, and 646. In one aspect, switches 640, 642, 644, and 646 are optional and need not be included. In that case, an open circuit exists between pairs of finger capacitors, e.g., between finger capacitors 612 and 622, between finger capacitors 610 and 624, between finger capacitors 608 and 626, and between finger capacitors 606 and 628.

Including switches 640, 642, 644, and 646 as shown in FIG. 6 allows the aforementioned finger capacitor pairs to be connected based upon the programming of each respective one of switches 640, 642, 644, and 646. In one aspect, switches 640, 642, 644, and 646 may be implemented using one or more transistors as known in the art. Closing a switch and connecting two finger capacitors of a finger capacitor pair has the effect of increasing the capacitance of circuit structure 600. Opening a switch to create an open circuit between two finger capacitors of a finger capacitor pair has the effect of reducing the capacitance of circuit structure 600.

By opening and/or closing particular ones of switches 640, 642, 644, and 646, the capacitance of circuit 600 may be varied thereby allowing circuit 600 to be tuned after fabrication. In one aspect, switches 640, 642, 644, and 646 are programmable by loading a bitstream and/or other configuration data into the particular IC in which circuit 600 is included. In another aspect, one or more or all of switches 640, 642, 644, and 646 can be controlled by control signals generated by other circuitry within the IC to provide dynamic control of the switches during operation of the IC while in the field. In any case, the capacitance of circuit structure 600 can be varied when operating in the field as may be desired responsive to various conditions detected by the IC and/or responsive to signals and/or conditions within the IC.

It should be appreciated that the number of finger capacitors in each of finger capacitor arrays 602 and 604 is selected for purposes of illustration only. Fewer or more finger capacitors may be included. In either case, however, the number of finger capacitors in each of finger capacitor arrays 602 and 604 may be matched, or equal. In this regard, the number of switches included varies with the number of finger capacitors included within finger capacitor arrays 602 and 604.

It also should be appreciated that not all finger capacitors need include a switch. For example, one or more pairs of finger capacitors (e.g., finger capacitors 612 and 622; finger capacitors 610 and 624, etc.) may be connected using a hardwired connection, while others are switchable. In still another aspect, all of the finger capacitor pairs may have a hardwired connection so as not to be switchable.

Figure 7:
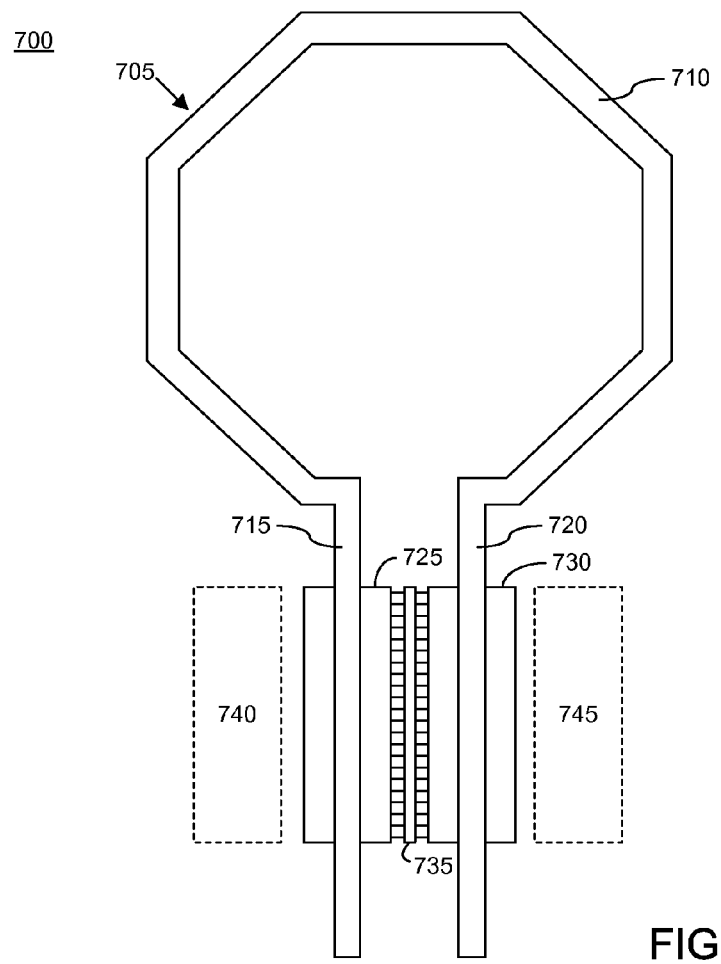
FIG. 7 is a block diagram illustrating another exemplary LC circuit structure.

FIG. 7 is a block diagram illustrating another exemplary LC circuit structure 700. LC circuit 700 includes an inductor 705 having one or more loops 710, a leg 715, and a leg 720. Leg 715 is formed parallel to leg 720.

In the example shown, inductor 705 includes a single loop or turn. As discussed with reference to FIG. 5, inductor 705 is not intended to be limited by the number of loops shown. Inductor 705 may include one or more additional full loops and/or one or more additional partial loops. In addition, the shape of loop 710, or loops as the case may be, of inductor 705 is not intended to be limited to octagonal. Loop 710 can be formed with a circular shape, a square shape, an oval shape, a spiral shape, or some other shape, in accordance with the constraints of the particular IC fabrication technology that is used.

Leg 715 is positioned above, and connected to, a finger capacitor element 725. Finger capacitor element 725 may be implemented as a finger capacitor as described with reference to FIGS. 1-3 or as a finger capacitor array as described with reference to FIG. 6, e.g., as finger capacitor array 602. As such, a center of one bus line of each finger capacitor of finger capacitor element 725 is coupled to leg 715 using a via structure. Leg 715 is positioned above finger capacitor element 725 and bisects finger capacitor element 725. Further, the attachment point of leg 715 to finger capacitor element 725, through the via structures, is located at a center of each respective bus line so that the via structure is symmetric about the center of each bus line.

Leg 720 is positioned above, and connected to, a finger capacitor element 730. Finger capacitor element 730 may be implemented as a finger capacitor as described with reference to FIGS. 1-3 or as a finger capacitor array as described with reference to FIG. 6, e.g., as finger capacitor array 604. As such, a center of one bus line of each finger capacitor of finger capacitor element 730 is coupled to leg 720 using a via structure. Leg 720 is positioned above finger capacitor element 730 and bisects finger capacitor element 730. Further, the attachment point of leg 720 to finger capacitor element 730, through the via structures, is located at a center of each respective bus line so that the via structure is symmetric about the center of each bus line.

Circuit 700 further includes a plurality of switches 735. Switches 735 can be implemented as described with reference to FIG. 6 and, more particularly, as switches 640, 642, 644, and 646. Accordingly, different ones of switches 735 may be closed and/or opened as required to vary the capacitance provided by finger capacitor elements 725 and 730, thereby allowing one to tune circuit 700. In another aspect, however, as described with reference to FIG. 6, one or more or all of the finger capacitor pairs including one finger capacitor from finger capacitor element 725 and a corresponding finger capacitor from finger capacitor element 730 may be connected by a hardwired connection.

In a conventional LC circuit configuration, the finger capacitor arrays are not located beneath the legs of the inductor. Referring to FIG. 7, for example, the finger capacitor array would be implemented entirely to the left of leg 715 in a conventional LC circuit configuration where block 740, shown with a dashed line, is located. Similarly, the other finger capacitor array would be implemented entirely to the right of leg 720 in a conventional LC circuit configuration where block 745, also shown with a dashed line, is located. The location of each respective finger capacitor array in locations 740 and 745 would necessitate edge injection of current, thereby lowering the Q of the LC circuit.

FIG. 8 is an exemplary method 800 of creating an LC circuit structure. More particularly, method 800 provides a high level description of fabricating an LC circuit structure as described within this disclosure. An LC circuit structure, as described herein, can be created using any of a variety of IC fabrication processes and/or materials known to the skilled artisan.

Accordingly, in block 805, a first finger capacitor is provided. The first finger capacitor has a first bus line coupled to a first plurality of finger elements and a second bus line coupled to a second plurality of finger elements. The first bus line is parallel to the second bus line. In block 810, an inductor is provided. The inductor has a first leg oriented perpendicular to the first bus line and the second bus line. The first leg is coupled to a center of the first bus line. In block 815, the first plurality of finger elements and the second plurality of finger elements are formed perpendicular to the bus lines. Individual ones of the first plurality of finger elements alternate with individual ones of the second plurality of finger elements.

In block 820, a second finger capacitor is provided. The second finger capacitor has a third bus line coupled to a third plurality of finger elements and a fourth bus line coupled to a fourth plurality of finger elements. The third bus line and the fourth bus line are parallel to the first bus line. The inductor further includes a second leg parallel to the first leg. The second leg of the inductor is coupled to a center of the third bus line. In block 825, a capacitance of the circuit is varied by selectively connecting the second bus line to the fourth bus line using a switch.

In another aspect, the first finger capacitor is implemented as a first array of finger capacitors. Each finger capacitor in the first array of finger capacitors can include a first bus line, a second bus line, a first plurality of finger elements, and a second plurality of finger elements as described. A center of the first bus line of each finger capacitor of the first array of finger capacitors can be connected to the first leg of the inductor.

Similarly, the second finger capacitor is implemented as a second array of finger capacitors. Each finger capacitor in the second array of finger capacitors can include a third bus line, a fourth bus line, a third plurality of finger elements, and a fourth plurality of finger elements as described. A center of the third bus line of each finger capacitor of the second array of finger capacitors can be connected to the second leg of the inductor.

Figure 9:
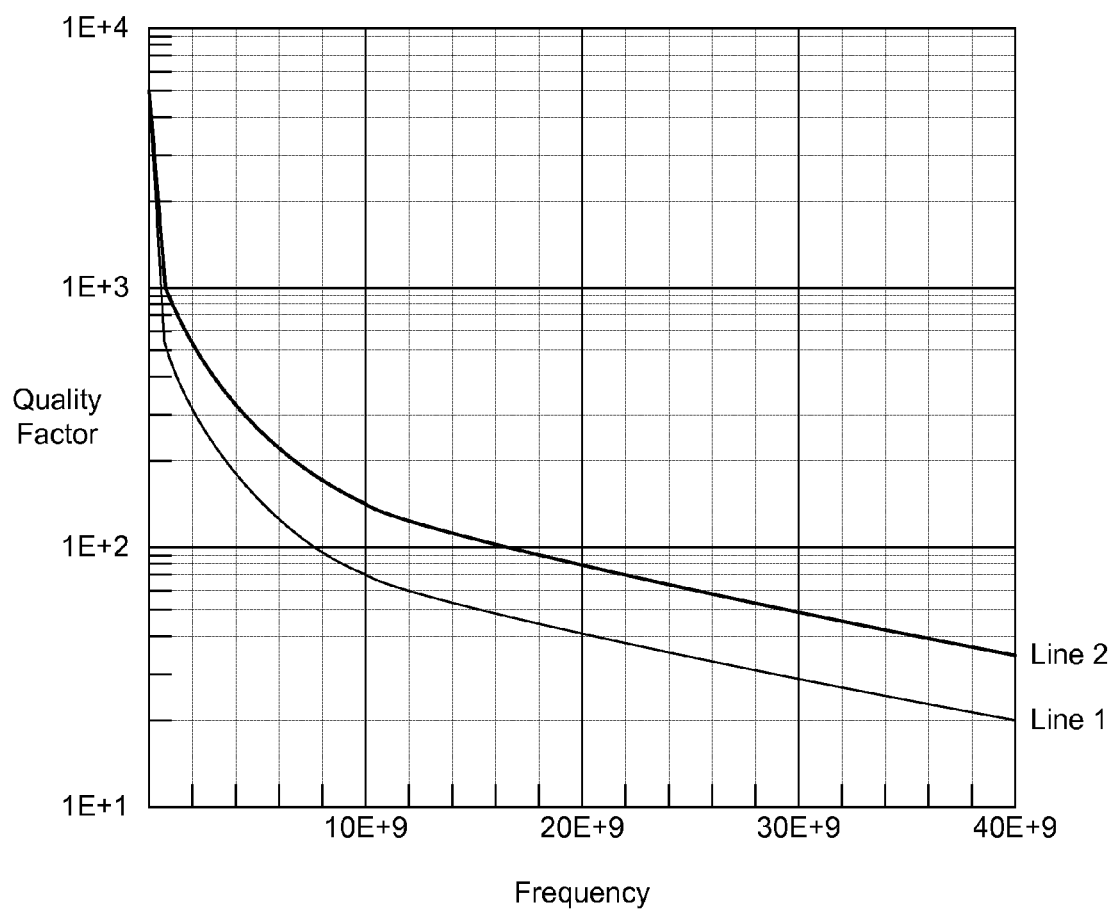
FIG. 9 is a graph plotting the Q factor of two different LC circuit structures against frequency.

FIG. 9 is a graph 900 plotting the Q factor of two different LC circuit structures against frequency. Line 1 represents the Q factor of a finger capacitor device in a conventional LC circuit structure plotted against frequency. In the case of a conventional LC circuit structure, the legs of the inductor are connected to the finger capacitors at the edge, or end, of the bus lines. Each leg of the inductor is connected to a finger capacitor array. A connection at the bus line edge increases resistance and decreases the Q factor of the circuit.

Line 2 represents the Q factor of a finger capacitor device in an LC circuit structure as described within this disclosure with reference to FIG. 7. The LC circuit structure used to generate line 2 connects each leg of the inductor to a center, as opposed to an edge, of the bus lines of the finger capacitors of the finger capacitor arrays. As shown, the Q factor for this configuration exceeds the Q factor of the conventional LC circuit structure at lower frequencies as well as at higher frequencies in and around 32 GHz and beyond.

This disclosure relates to semiconductor ICs and, more particularly, to a high quality factor LC circuit structure for use within a semiconductor IC. A high quality factor is achieved, at least in part, by connecting the finger capacitors to the inductor at a center of one bus line of each finger capacitor. By attaching the finger capacitors to the inductor at the center of the bus lines as opposed to the edges, current from the inductor is injected into each finger capacitor at the center of the finger capacitor. Injecting current into the center of the bus line reduces the length of the path that the current travels within the finger capacitor, thereby reducing the series resistance for the finger capacitor, and increasing Q factor.

For purposes of explanation, specific nomenclature is set forth to provide a thorough understanding of the various inventive concepts disclosed herein. The terminology used herein, however, is for the purpose of illustrating the features described and is not intended to be limiting.

For example, the terms "a" and "an," as used herein, are defined as one or more than one. The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The term "and/or" as used herein refers to and encompasses any and all possible combinations of one or more of the associated listed items. It will be further understood that the terms "includes" and/or "including," when used in this disclosure, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another.

The term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

The flowchart and block diagrams in the Figures illustrate the architecture, functionality, and operation of possible implementations of process(es), machine(s), manufacture(s), and/or systems utilizing one or more of the features described herein. In some alternative implementations, the functions noted in the blocks may occur out of the order noted in the figures. For example, two blocks shown in succession may be executed substantially concurrently, or the blocks may sometimes be executed in the reverse order, depending upon the functionality involved.

The corresponding structures, materials, acts, and equivalents of all means or step plus function elements in the claims below are intended to include any structure, material, or act for performing the function in combination with other claimed elements as specifically claimed.

The features disclosed within this specification can be embodied in other forms without departing from the spirit or essential attributes thereof. Accordingly, reference should be made to the following claims, rather than to the foregoing specification, as indicating the scope of such features and implementations.

What is claimed is:

1. A circuit, comprising:
a first finger capacitor comprising a first bus line coupled to a first plurality of finger elements and a second bus line coupled to a second plurality of finger elements;
wherein the first bus line is parallel to the second bus line;
an inductor comprising a first leg oriented perpendicular to the first bus line and the second bus line;
wherein the first leg is implemented in a conductive layer above the first finger capacitor; and
a first via structure coupled between the first leg and the first bus line;
wherein the first leg of the inductor bisects the first finger capacitor and is coupled to a center of the first bus line by the first via structure; and
wherein the first via structure is disposed symmetrically about a line at the center of the first bus line that is perpendicular to the first bus line.

2. The circuit of claim 1, wherein:
the first plurality of finger elements and the second plurality of finger elements are perpendicular to the first and second bus lines; and
wherein individual ones of the first plurality of finger elements alternate with individual ones of the second plurality of finger elements.

3. The circuit of claim 2, wherein the first bus line, the second bus line, the first plurality of finger elements, and the second plurality of finger elements are implemented in a first plane.

4. The circuit of claim 3, wherein the inductor is implemented in at least a second plane different from the first plane and parallel to the first plane.

5. The circuit of claim 1, further comprising:
a second finger capacitor comprising a third bus line coupled to a third plurality of finger elements and a fourth bus line coupled to a fourth plurality of finger elements;
wherein the third bus line and the fourth bus line are parallel to the first bus line;
wherein the conductive layer is above the second finger capacitor; and
wherein the first leg of the inductor bisects the second finger capacitor and is coupled to a center of the third bus line by a second via structure.

6. The circuit of claim 1, further comprising:
a second finger capacitor comprising a third bus line coupled to a third plurality of finger elements and a fourth bus line coupled to a fourth plurality of finger elements;
wherein the third bus line and the fourth bus line are parallel to the first bus line;
wherein the inductor comprises a second leg parallel to the first leg;
wherein the second leg is implemented in the conductive layer and is above the second finger capacitor; and
wherein the second leg of the inductor bisects the second finger capacitor and is coupled to a center of the third bus line by a second via structure.

7. The circuit of claim 6, further comprising:
a first switch configured to selectively couple the second bus line to the fourth bus line.

8. The circuit of claim 6, further comprising:
a third finger capacitor comprising a fifth bus line coupled to a fifth plurality of finger elements and a sixth bus line coupled to a sixth plurality of finger elements;
wherein the fifth bus line and the sixth bus line are parallel to the first bus line;
wherein the conductive layer is above the third finger capacitor; and
wherein the first leg of the inductor bisects the third finger capacitor and is coupled to a center of the fifth bus line by a third via structure; and
a fourth finger capacitor comprising a seventh bus line coupled to a seventh plurality of finger elements and an eighth bus line coupled to an eighth plurality of finger elements;
wherein the seventh bus line and the eighth bus line are parallel to the first bus line;
wherein the conductive layer is above the fourth finger capacitor; and
wherein the second leg of the inductor bisects the fourth finger capacitor and is coupled to a center of the seventh bus line by a fourth via structure.

9. The circuit of claim 8, further comprising:
a second switch configured to selectively couple the sixth bus line to the eighth bus line.

10. A circuit, comprising:
a first plurality of finger capacitors implemented in a first plane;
wherein each finger capacitor of the first plurality of finger capacitors comprises a first bus line coupled to a first plurality of finger elements and a second bus line parallel to the first bus line and coupled to a second plurality of finger elements;
a second plurality of finger capacitors implemented in the first plane;
wherein each finger capacitor of the second plurality of finger capacitors comprises a third bus line coupled to a third plurality of finger elements and a fourth bus line parallel to the third bus line and coupled to a fourth plurality of finger elements;
wherein the third bus line is parallel to the first bus line;
an inductor comprising a first leg oriented perpendicular to the first bus line and a second leg parallel to the first leg;
wherein the first leg of the inductor is coupled to a center of each first bus line of the first plurality of finger capacitors;
wherein the second leg of the inductor is coupled to a center of each third bus line of the second plurality of finger capacitors;
wherein the first leg and the second leg are implemented within a conductive layer above the first and second plurality of finger capacitors; and
wherein the first leg bisects each of the finger capacitors of the first plurality of finger capacitors and the second leg bisects each of the finger capacitors of the second plurality of finger capacitors.

11. The circuit of claim 10, further comprising:
a plurality of switches, wherein each switch is individually configurable to couple each of the respective second bus lines to the corresponding fourth bus lines.

12. A method, comprising:
providing a first finger capacitor of a circuit;
wherein the first finger capacitor comprises a first bus line coupled to a first plurality of finger elements and a second bus line coupled to a second plurality of finger elements;
wherein the first bus line is parallel to the second bus line; and
providing an inductor comprising a first leg oriented perpendicular to the first bus line and the second bus line;
wherein the first leg is implemented in a conductive layer above the first finger capacitor; and
coupling a first via structure between the first leg and the first bus line;
wherein the first leg of the inductor bisects the first finger capacitor and is coupled to a center of the first bus line by the first via structure; and
wherein the first via structure is disposed symmetrically about a line at the center of the first bus line that is perpendicular to the first bus line.

13. The method of claim 12, wherein:
the first plurality of finger elements and the second plurality of finger elements are perpendicular to the first and second bus lines; and
wherein individual ones of the first plurality of finger elements alternate with individual ones of the second plurality of finger elements.

14. The method of claim 13, further comprising:
implementing the first bus line, the second bus line, the first plurality of finger elements, and the second plurality of finger elements in a first plane.

15. The method of claim 14, further comprising:
implementing the inductor in at least a second plane different from the first plane and parallel to the first plane.

16. The method of claim 12, further comprising:
providing a second finger capacitor comprising a third bus line coupled to a third plurality of finger elements and a fourth bus line coupled to a fourth plurality of finger elements;
wherein the third bus line and the fourth bus line are parallel to the first bus line; and
wherein the first leg of the inductor is coupled to a center of the third bus line.

17. The method of claim 12, further comprising:
providing a second finger capacitor comprising a third bus line coupled to a third plurality of finger elements and a fourth bus line coupled to a fourth plurality of finger elements;
wherein the third bus line and the fourth bus line are parallel to the first bus line;
wherein the inductor comprises a second leg parallel to the first leg;
wherein the second leg is implemented in the conductive layer and is above the second finger capacitor; and
wherein the second leg of the inductor bisects the second finger capacitor and is coupled to a center of the third bus line by a second via structure.

18. The method of claim 17, further comprising:
varying a capacitance of the circuit by selectively coupling the second bus line to the fourth bus line using a first switch.

19. The method of claim 17, further comprising:
providing a third finger capacitor comprising a fifth bus line coupled to a fifth plurality of finger elements and a sixth bus line coupled to a sixth plurality of finger elements;
wherein the fifth bus line and the sixth bus line are parallel to the first bus line;
wherein the conductive layer is above the third finger capacitor; and
wherein the first leg of the inductor bisects the third finger capacitor and is coupled to a center of the fifth bus line; and
providing a fourth finger capacitor comprising a seventh bus line coupled to a seventh plurality of finger elements and an eighth bus line coupled to an eighth plurality of finger elements;
wherein the seventh bus line and the eighth bus line are parallel to the first bus line;
wherein the conductive layer is above the fourth finger capacitor; and
wherein the second leg of the inductor bisects the fourth finger capacitor and is coupled to a center of the seventh bus line by a fourth via structure.

20. The method of claim 19, further comprising:
varying a capacitance of the circuit by selectively coupling the sixth bus line to the eighth bus line using a second switch.

* * * * *